(12) United States Patent
Kajiwara et al.

(10) Patent No.: US 8,313,983 B2
(45) Date of Patent: Nov. 20, 2012

(54) FABRICATION METHOD FOR RESIN-ENCAPSULATED SEMICONDUCTOR DEVICE

(75) Inventors: Ryoichi Kajiwara, Hitachi (JP); Shigehisa Motowaki, Mito (JP); Kazutoshi Itou, Hitachi (JP); Hiroshi Hozoji, Hitachiota (JP)

(73) Assignee: Hitachi, Ltd., Tokyo (JP)

( * ) Notice: Subject to any disclaimer, the term of this patent is extended or adjusted under 35 U.S.C. 154(b) by 2 days.

(21) Appl. No.: 13/108,430

(22) Filed: May 16, 2011

(65) Prior Publication Data

US 2011/0223720 A1    Sep. 15, 2011

Related U.S. Application Data

(62) Division of application No. 12/320,559, filed on Jan. 29, 2009, now Pat. No. 7,964,975.

(30) Foreign Application Priority Data

Jan. 31, 2008 (JP) ................................. 2008-020045

(51) Int. Cl.
 *H01L 21/44* (2006.01)
(52) U.S. Cl. ................................. 438/124; 257/E21.503
(58) Field of Classification Search .................. 438/617, 438/681
 See application file for complete search history.

(56) References Cited

U.S. PATENT DOCUMENTS

| 6,855,579 B2 * | 2/2005 | Takeda et al. | ................. 438/127 |
| 7,199,453 B2 * | 4/2007 | Lai et al. | ....................... 257/666 |
| 2006/0278254 A1 | 12/2006 | Jackson | |
| 2007/0145606 A1 | 6/2007 | Mahler et al. | |

FOREIGN PATENT DOCUMENTS

| JP | 58-202556 | 11/1983 |
| JP | 2007-508448 | 4/2007 |
| JP | 2007-266562 | 10/2007 |
| WO | WO 2005/021836 A2 | 3/2005 |

OTHER PUBLICATIONS

JP Office Action of Appln. No. 2008-020045 dated May 18, 2010 with partial translation.
Mohamed Lebbai, et al., "Surface Characteristics and Adhesion Performance of Black Oxide Coated Copper Substrate With Epoxy Resins", J. Adhesion Sci. Technol., 17, 2003, pp. 1543-1560.

* cited by examiner

*Primary Examiner* — Chandra Chaudhari
(74) *Attorney, Agent, or Firm* — Antonelli, Terry, Stout & Kraus, LLP.

(57) ABSTRACT

A fabrication method for a resin encapsulated semiconductor device includes the steps of: (1) die-bonding a semiconductor device to a first electrical connection metallic terminal of a wiring substrate; (2) electrically connecting an electrode of the semiconductor device and a second electrical connection metallic terminal of the wiring substrate via an electrical connector; (3) surface treating such an assembly by applying a solution to a surface of the assembly and baking the applied solution; and (4) transfer-molding an insulating encapsulating resin onto the surface-treated assembly.

12 Claims, 9 Drawing Sheets

FABRICATION METHOD FOR RESIN-ENCAPSULATED SEMICONDUCTOR DEVICE

CLAIM OF PRIORITY

The present application is a divisional application of application Ser. No. 12/320,559, filed on Jan. 29, 2009 now U.S. Pat. No. 7,964,975, which claims priority from Japanese patent application serial no. 2008-020045, filed on Jan. 31, 2008, the contents of each of which are hereby incorporated by reference into this application.

BACKGROUND OF THE INVENTION

1. Field of the Invention

The present invention relates to metal/polymer-resin bonded structured bodies and fabrication methods for such a structured body. The invention also relates to oxide coatings (formed on a metal base) for enhancing the bonding strength between the metal base and a polymer resin and forming methods for such a coating. The invention further relates to high reliability resin encapsulated semiconductor devices in which such an above-mentioned coating is provided between the encapsulating resin and the semiconductor device assembly, and fabrication methods for such a resin encapsulated semiconductor device.

2. Description of Related Art

In most semiconductor devices, a polymer resin needs to be bonded to metals such as Ni (nickel), Au (gold), Ag (silver), and Cu (copper). However, these metals have poor bondability to such a polymer resin and therefore can be a cause of reliability degradation of such semiconductor devices. In order to improve the bonding strength between a metal and a polymer resin, a method is disclosed in which an organic compound (such as a coupling agent or triazine) is applied over the surface of the metal (see, e.g., JP-A-2007-266562). Another method is disclosed in which a Zn (zinc) alloy coating having a mesh structure is formed on a metal surface by electroplating (see, e.g., JP-A-2007-508448, WO2005/021836). Still another method is disclosed in which the surface of Cu metal is oxidized in a hot alkaline solution to improve bonding strength (see, e.g., Mohamed Lebbai, et al.: J. Adhesion Sci. Technol., 17, 2003, pp. 1543-1560).

According to the JP-A-2007-266562, organic compounds such as coupling agents and triazine are coating materials containing both a functional group which can bond to metal and a functional group that can bond to organic materials. And, a crystallographically oriented layer made of such a coating material is formed on a metal surface, thereby allowing the metal to strongly bond to a polymer resin. A polymer resin can also be strongly bonded to insulators by choosing a suitable coating material.

According to the JP-A-2007-508448 (WO2005/021836), a coating made of Zn, Cr (chromium), or a Zn-alloy and having a mesh structure can be electroplated by dipping in an alkaline solution, and then a polymer resin infiltrates such a mesh structure to create an anchor effect by which the resin can strongly bond to the coating. Such a strong bonding strength can be sufficiently maintained even in harsh environments such as high humidity and severe thermal cycles, and therefore what is called a "popcorn phenomenon" which is caused by explosive vaporization of moisture accumulated in a semiconductor device can be prevented.

According to Lebbai et al., a Cu-oxide layer having a mesh structure can be formed on a Cu surface by oxidization in an alkaline solution, thus providing effects similar to those of the electroplating method of the JP-A-2007-508448 (WO2005/021836). However, the material usable for forming such a mesh structure by oxidation is limited to only Cu.

Conventional methods (such as those described above) for improving bondability by forming a coating using an organic material are effectively applicable to various underlying materials, but have a problem in that such a coating can degrade wettability of molten solders or degrade metal-to-metal bondability. In order to avoid this problem, such a coating needs to be selectively applied to only necessary areas of a surface of a semiconductor device. Or alternatively, unnecessary portions of such a coating (e.g., soldering portion, wire bonding portion and etc.) need to be removed after such the coating is applied onto a semiconductor device. However such procedures have a problem with degrading yield or productivity. The above procedures also have a manufacturability problem in that such selective coating is difficult at surface areas below bonding wires.

The above-described method of forming a coating having a mesh structure by electroplating can be applied to various underlying materials with electrical conductivity, but has a problem because amphoteric metals such as Al (aluminum) can be etched by the alkaline solution used for the plating. In particular, when such a surface treatment using an alkaline solution is applied to a semiconductor-device mounting assembly immediately before the process step of encapsulating a resin over the assembly, the Al thin film wirings of the semiconductor device can be damaged, leading to degraded circuit performance. This method also has the following limitations: (1) It is difficult to apply the method to an assembly in which some metal portions for electrical connection are disposed in floating islands. (2) An assembly to be electroplated needs to be sufficiently smaller so that it can be entirely immersed in the plating tank used. (3) The plating current density needs to be uniform over the surfaces of an assembly to be electroplated. Furthermore, in this method a cleaning procedure cannot be dispensed with, thus degrading productivity. Here, when such a cleaning procedure is insufficient, residues of the plating electrolyte used can cause corrosion in harsh use environments such as high temperature, high humidity, and biased conditions, thus potentially leading to degraded corrosion reliability.

The above-described oxidization treatment of Cu in a hot alkaline solution, similarly to the above electroplating method, has a problem in which the alkaline solution can etch and damage the Al wires for wire bonding or the Al thin film wirings of the semiconductor device. This method has another problem in that Cu in the bonding interface region is oxidized at high temperature and high humidity, and such a Cu-oxide layer can decrease the bonding strength. Further, similarly to the above-described electroplating method, this method also requires a cleaning procedure, thus degrading productivity.

Finally, in the above-described electroplating method, in order to avoid the problem of degraded reliability due to corrosion, a coating (which can strongly bond to a polymer resin) may be pre-electroplated to a bare lead frame by immersion in an electrolyte solution before a semiconductor device is mounted onto the lead frame. However, such an avoidance measure still has a problem because such a coating can degrade solder wettability and wire-bonding bondability (vital properties for semiconductor device assembly).

SUMMARY OF THE INVENTION

Under these circumstances, in order to address the above problems, it is an objective of the present invention to provide a method for surface treating a metal base (such as Ni, Ag, Au, and Cu), which can enhance the bonding strength between the entire surface of the metal base and polymer resins irrespective of the size and shape of the metal base while maintaining solder wettability and without sacrificing productivity. It is another objective of the invention to provide a metal/polymer-resin bonded structured body having strong bonding strength. Furthermore, it is another objective of the invention to provide a resin encapsulated semiconductor device having excellent long term reliability even in harsh environments such as high temperature, high humidity, and severe thermal cycles, and to provide a low cost method for fabricating such the resin encapsulated semiconductor device.

(1) According to one aspect of the present invention, there is provided a fabrication method for a metal-base/polymer-resin bonded structured body, including the steps of:

(a) applying, to a surface of the metal base, a solution containing an organometallic compound decomposable at 350° C. or lower;

(b) baking the applied solution in an oxidizing atmosphere to form, on the surface of the metal base, a coating containing an oxide of the metal of the organometallic compound;

(c) providing the polymer resin on the coating; and (d) hardening the polymer resin to provide the metal-base/polymer-resin bonded structured body.

In the above aspect (1) of the present invention, the following modifications and changes can be made.

(i) The step (c) of providing the polymer resin is performed by application or injection-molding.

(ii) The organometallic compound includes a metal "M" different from the metal of the metal base, carbon (C), hydrogen (H), and optionally oxygen (O); the solvent of the solution is an organic solvent capable of dissolving the organometallic compound or water; and the content of the metal "M" in the solution is from 0.001 to 1.0 wt %.

(iii) The step (b) of baking the applied solution is performed at temperatures from 150 to 400° C. to form the coating containing mainly the oxide of the metal "M".

(iv) Prior to the step (a) of applying the solution, the fabrication method further includes the step of cleaning the surface of the metal base by one of: dry chemical cleaning (by irradiation with UV-light or in ozone gas); physicochemical cleaning in an argon (Ar) or oxygen (O) plasma; or heating in a reducing atmosphere at 200° C. or higher.

(2) According to another aspect of the present invention, there is provided a fabrication method for a resin encapsulated semiconductor device comprising: a wiring substrate having first and second electrical connection metallic terminals; a semiconductor device; an electrical connector for electrically connecting the second electrical connection terminal to the semiconductor device; and an insulating encapsulating resin covering at least a portion of an assembly composed of the wiring substrate (including the first and second electrical connection metallic terminals), the semiconductor device and the electrical connector, the fabrication method including the steps of:

(e) die-bonding the semiconductor device to the first electrical connection metallic terminal;

(f) electrically connecting an electrode of the semiconductor device and the second electrical connection metallic terminal via the electrical connector;

(g) surface treating the assembly by applying a solution containing an organometallic compound to the surface of the assembly and subsequently by baking the solution; and (h) transfer-molding the insulating encapsulating resin onto the surface-treated assembly.

In the above aspect (2) of the present invention, the following modifications and changes can be made.

(v) The organometallic compound includes a metal and an organic molecule made of carbon (C), hydrogen (H), and oxygen (O) atoms; the number of carbon atoms in the organic molecule is 30 or less; and the content of the metal in the solution is from 0.001 to 1.0 wt %.

(vi) The baking in the step (g) is performed at temperatures from 150 to 400° C. in an oxidizing atmosphere.

(vii) Prior to the applying the solution in the step (g), the fabrication method further includes the step of cleaning the surface of the wiring substrate by one of: dry chemical cleaning (by irradiation with UV-light or in ozone gas); physicochemical cleaning in an argon or oxygen plasma; or heating in a reducing atmosphere at 200° C. or higher.

(viii) Between the baking the solution in the step (g) and the step (h) of transfer-molding the insulating encapsulating resin, the fabrication method further includes the step of performing a reduction treatment by heating in a hydrogen-containing reducing (deoxidizing) atmosphere.

(ix) The baking the solution in the step (g) is performed simultaneously with irradiating the surface of the assembly with UV-light.

(3) According to another aspect of the present invention, there is provided a bonded structured body of a metal base made of a first metal and a polymer resin, comprising:

a first layer formed on the metal base, the first layer being made of one of: a second metal; and an alloy (or a metallic compound) of the first and second metals; and a second layer formed on the first layer, the second layer mainly containing an oxide of the second metal and having a thickness from 5 to 600 nm, in which the second metal has a free energy of oxide formation less than that of the first metal.

(4) According to another aspect of the present invention, there is provided a resin encapsulated semiconductor device comprising:

a wiring substrate having metal and insulator surfaces;

a semiconductor device; an electrical connector for electrically connecting the wiring substrate and the semiconductor device;

an encapsulating resin covering at least a portion of an assembly composed of the wiring substrate, the semiconductor device and the electrical connector; and a coating provided between the encapsulating resin and the metal and insulator surfaces of the assembly, the coating containing an oxide of a metal selected from a group consisting of Zn (zinc), Zr (zirconium), Al (aluminum), Ti (titanium), V (vanadium), Mn (manganese), and Mg (magnesium).

In the above aspect (4) of the present invention, the following modifications and changes can be made.

(x) Over each of the metal surface portions of the assembly, the coating has a multi-layer structure of:

a first layer formed on the metal surface portion, the first layer being made of one of: the metal of the coating; or an alloy (or a metallic compound) of the metal of the coating and the metal of the metal surface portion; and a second layer formed on the first layer, the second layer mainly containing the oxide of the coating.

(5) According to another aspect of the present invention, there is provided a lead frame comprising:

a base made of a Cu or Cu-alloy, the base optionally having an Ni plating layer on its surface, the Ni plating layer optionally having an Ag plating layer on its surface; and a coating formed on the surface of the base, the coating mainly containing an oxide of a metal selected from a group consisting of Zn, Zr, Ti, and Al and having a thickness from 5 to 600 nm.

(6) According to another aspect of the present invention, there is provided a ceramic wiring board comprising:
an insulating ceramic substrate;
a wiring pattern formed on the substrate and made of Cu or Al;
an Ni plating layer on the wiring pattern; and
a coating formed on the Ni plating layer, the coating mainly containing an oxide of a metal selected from a group consisting of Zn, Zr, Ti, and Al and having a thickness from 5 to 600 nm.

ADVANTAGES OF THE INVENTION

The present invention can provide a method for surface treating a metal base, which can enhance the bonding strength between the entire surface of the metal base and polymer resins irrespective of the size and shape of the metal base while maintaining solder wettability and without sacrificing productivity. The invention can also provide a low cost, high reliability resin encapsulated semiconductor device.

DETAILED DESCRIPTION OF THE PREFERRED EMBODIMENTS

Figure 1:
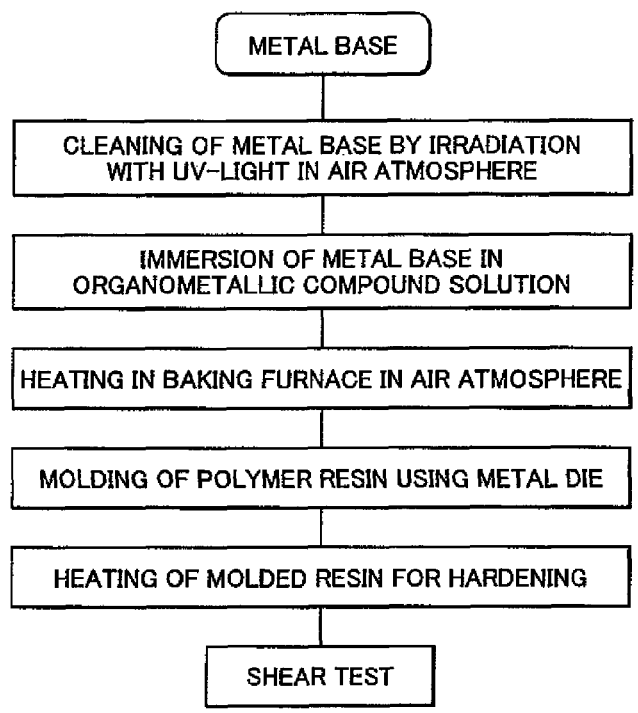
FIG. 1 is a process flow showing a fabrication method for a metal-resin bonded structured body according to the present invention.

An embodiment of the present invention will be described in detail below. The embodiment will be presented only by way of example for implementing the invention and not by way of limitation.

In order to achieve an objective of the present invention, a fabrication method for a metal-base/polymer-resin bonded structured body according to the invention includes the steps of: applying a solution containing an organometallic compound decomposable below 350° C. onto a metal base; baking the applied solution in an oxidizing atmosphere to form a coating mainly containing oxides of the metal of the organometallic compound; and applying or injection-molding a polymer resin onto the surface of the coating. The coating mainly containing the metal oxides can be formed by baking at 150 to 400° C. The obtained coating has a multi-layer structure comprising: a 5 to 600 nm thick first layer made primarily of oxides of the coating metal and having microroughness on its surface and numerous voids therein; and, underneath the first layer, a second layer made of the coating metal or an alloy (or a metallic compound) of the coating metal and the metal base. The metal base and the polymer resin are bonded to each other via this intermediate coating layer.

The smooth surfaces of Ni, Ag, Au, and Cu, which are commonly used in semiconductor devices, have poor bondability to polymer resins. Even Cu exhibiting relatively high bondability has a bonding strength of only 5 to 7 MPa. The others possess poorer or almost no bondability. Furthermore, polymer resins tend to absorb (bond to) moisture; therefore, when even Cu is used, the bondability will be degraded if moisture is present at the bonding interface. Generally, the bonding strength between a metal and a resin depends on the chemical bond strength between the functional groups of the resin and the metal. Therefore, the above-described particularly poor bondabilities of Ni, Ag, and Au are attributable to the fact that these metals do not readily bond to the functional groups of resins. In addition, Cu has the following problem: The surface region of Cu under the bonding interface of a resin-metal bonded structure is readily oxidized when exposed to high temperatures and grows a thick oxide film. Such a thick oxide film tends to be more readily fractured or peeled off from the underlying base Cu, thus significantly degrading the overall bonding strength.

It is conventionally known that metals having excellent bondability to polymer resins are readily oxidizable metals. Currently known methods for forming such a readily oxidizable metal on Ni, Cu, Ag, and Au are limited to wet plating techniques and physical vapor deposition (vacuum vapor deposition) techniques. However, wet plating techniques have a problem in that such techniques immerse a metal base in an aqueous solution of an electrolyte, and therefore, in some metals, the surface region can be dissolved in the solution or residues of the solution can later cause corrosion. Also, wet plating techniques disadvantageously require an extra cleaning procedure. Physical vapor deposition techniques have problems with high processing costs because such techniques use vacuum processing, which leads to low productivity and high equipment cost.

In this situation, the present inventors have focused attention on low temperature decomposable organometallic compounds and conceived an idea that a metal coating can be simply formed just by thermally decomposing such a low temperature decomposable organometallic compound and producing fine metal particles having low-temperature bondability (sinterability) like metal nanoparticles. Through intensive experiments and investigations by the inventors, it was found that the bonding strength between an Ni base and an epoxy resin could be increased several-fold by using the following method including the steps of: applying a solution of an organic compound (such as a 2-ethylhexanoate or neodecanoate) of a metal (such as Zn, Zr, Al, or Ti) to the surface of the Ni base which is usually difficult to bond to the epoxy resin; baking the applied solution at 200 to 280° C. in an air atmosphere to form a coating; and molding the epoxy resin onto the surface of the coating followed by hardening.

The inventors have also obtained the following results: For some coating types, advantageously the bonded structured body is broken caused by cohesive fracture of the resin, not by interfacial delamination. Concentrations of the metal of the organic compound in the solution, which are effective in improving the bonding strength to the epoxy resin, are 0.001 to 1.0 wt %. Lower concentrations have little effect on enhancing the bonding strength. Higher concentrations result in thicker coatings, and residual stress in such a thick coating decreases the adhesive strength to the underlying metal base. The thicknesses of the thus formed coatings are several nanometers to several hundreds of nanometers, and the coatings have noticeable microroughness on their surface and numerous voids therein. When a flux-cored solder paste is applied to such a porous coating, the coating is relatively easily broken and the solder can adequately wet the underlying base.

Figure 3:
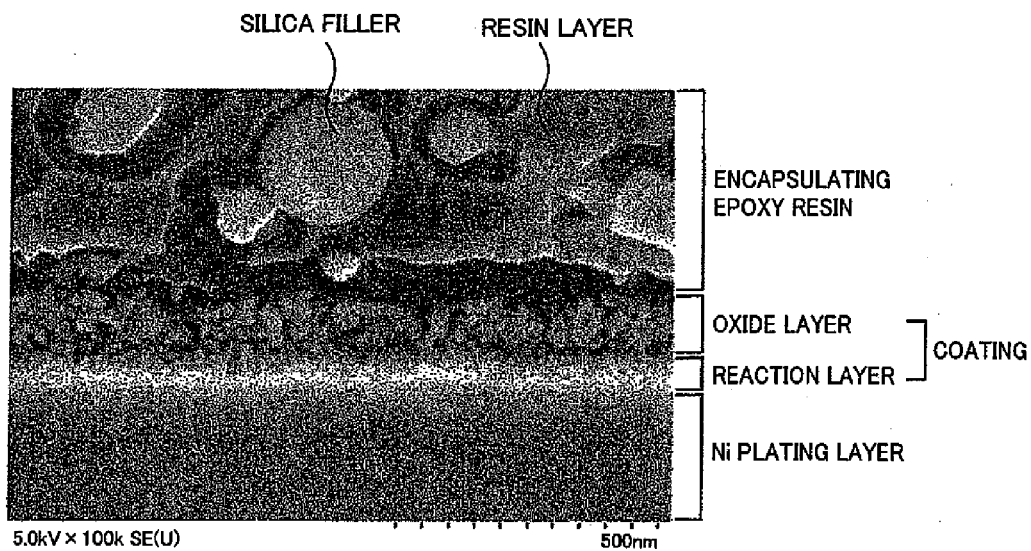
FIG. 3 is an SEM (scanning electron microscopy) image of a cross section about a bonding region of a metal-resin bonded structured body in which a thicker Zn coating is applied according to the present invention.

The inventors think that coatings prepared according to this novel method are formed by the following mechanism:

It is generally considered that when an organometallic compound is heated in an oxidizing atmosphere, it is decomposed to first produce the constituent metal which is then oxidized, and as a result, fine particles of an oxide of the constituent metal are deposited on the surface of an underlying metal base. Usually, such oxides do not strongly adhere to the underlying metal base; therefore coatings formed by this mechanism cannot provide sufficient adhesiveness to the underlying base. Contrary to the above explanation, coatings formed according to the invention exhibit strong adhesiveness to the underlying base. A probable explanation for this invention result is as follows: The decomposition of the organometallic compound also produces reducing gases such as H, CO, and CH, which temporarily prevents the oxidation the constituent metal produced by the decomposition, and such temporarily existing active metal atoms form a strong metallic bond to the underlying base. That is, a thin alloy (or metallic compound) layer is first formed and then its surface is oxidized by the oxidizing atmosphere. FIG. 3 is an SEM (scanning electron microscopy) image of a cross section about a bonding region of an example of a resin-metal bonded structured body according to the invention. As can be observed, a reaction layer is formed by reaction with the underlying base, and on this reaction layer is formed a layer of a population of oxide particles which has numerous voids therein and a noticeable microroughness on its surface.

Such a porous oxide coating is difficult to form by other well-known methods such as plating techniques and vapor deposition techniques. Thus, the above-described coating structure appears to be a peculiar microstructure that only the invented method (including the step of baking an organometallic compound) can provide. In addition, the improved bonding strength between the metal base and the epoxy resin is provided not only by coating another metal which can readily bond to the epoxy resin but also by providing the coating surface with a microroughness thereby improving the mechanical adhesion strength. That is, the overall bonding strength is improved by both an enhanced chemical bond strength and an enhanced mechanical adhesion strength, which is probably the reason why the invented resin-metal bonded structured bodies can be provided with such high bonding strengths (as described later in FIG. 2).

Thus, the invented method uses such a simple procedure which only involves applying a solution containing an organometallic compound on the surface of a metal base and baking the applied solution. Therefore, the invented coating can be readily applied to any metal base irrespective of the size and shape. As described, the coat-forming method of the invention uses a simple process and only a small amount of an organometallic compound, leading to high productivity and low material cost. As described, the invented method can greatly enhance the bonding strength between a metal base and a polymer resin not only by an increased chemical bond strength (which is provided by coating another metal which can readily bond to the polymer resin) but also by an increased mechanical adhesion strength (which is given by providing the coating surface with microroughness).

In order to achieve the second another objective of the present invention, a fabrication method for a resin encapsulated semiconductor device according to the invention includes: the conventional step of die-bonding a semiconductor device to a first connection terminal (such as a die pad) of a lead frame or a circuit board; the conventional step of electrically connecting an electrode of the semiconductor device and a second electrical connection terminal of the lead frame or the circuit board by wire bonding or lead bonding; the invented surface treatment steps of applying an organometallic-compound containing solution over the entire surface of the thus assembled semiconductor device assembly and baking the applied solution in an air atmosphere; and the conventional step of transfer molding an encapsulating resin onto the semiconductor device assembly. In this method, between the surfaces of the semiconductor device assembly and the encapsulating resin is formed a 5 to 600 nm thick coating made mainly of an oxide of a metal selected from a group consisting of Zn, Zr, Al, Ti, V, Mn, and Mg. The resin and the assembly are bonded to each other via this intermediate coating layer.

The reliability of the resin encapsulated semiconductor device can be degraded by, for example, the following direct causes: thermal stress developed at the interface between the semiconductor device and the first connection terminal (such as a die pad) causes crack formation, leading to decreased thermal or electrical conductance. Or, crack formation occurs at the bonding interface between the electrode of, the semiconductor device or the second connection terminal of the lead frame or circuit board and the bonding wire or bonding lead, leading to degraded electrical conductance. A major cause of such crack formation is interfacial peeling between the encapsulating resin and semiconductor device assembly. Thus, the reliability of a resin encapsulated semiconductor device can be greatly improved by prevention of such interfacial peeling between the encapsulating resin and semiconductor device assembly.

Such an encapsulating resin needs to be bonded to various materials of a semiconductor device assembly, including: metals used in the wiring substrate (such as Ni, Cu, Ag, and Au); die bonding solders; materials used in the semiconductor device (such as Si, Al electrodes, and inorganic insulators); and electrical connection Al wires for assembly. Among these, particularly sensitive to semiconductor device reliability are the bonding interface between the encapsulating resin and the metals used in the wiring substrate (such as Ni, Cu, Ag, and Au) as well as the bonding interface between the resin and the die bonding solder. In the invented method for fabricating a resin encapsulated semiconductor device, the organometallic-compound containing solution can be readily applied over the entire surface of the semiconductor device assembly by immersion or spraying using simple equipment. And, the heating of the semiconductor device assembly to 15.0 to 400° C. can also be performed using simple equipment. So, if such a surface treatment step is incorporated into a conventional process for assembling a resin encapsulated semiconductor device, it will not degrade productivity such as that of the automated assembly line. In addition, in the invented method, the organometallic compound is used in a high dilution, thus posing no material cost problems. Further, in the invented method, the surfaces of the semiconductor device assembly are coated with a layer containing a metal more readily bondable to an encapsulating resin (such as Zn, Zr, Al, Ti, V, Mn, and Mg) by decomposition of an organometallic compound containing the metal; thereby an increased bonding strength between the assembly and resin can be provided. Therefore, even when an inexpensive encapsulating resin is used, crack formation at the die bonding interface or the electrical connection interface can be prevented for a long service life.

While a semiconductor device assembly has some surface regions that must be insulated from each other, the invented thin coating formed by baking of an organometallic compound is made of an insulating or highly resistive oxide, thus not causing short circuit failure. As described, the invented method for fabricating a resin encapsulated semiconductor device can improve the bonding strength of the resin and can thereby greatly enhance the long term reliability in actual use environments while maintaining a fabrication cost comparable to those of conventional methods.

The embodiment of the present invention will be more specifically described below with reference to the accompanying drawings.

FIG. 1 is a process flow showing a fabrication method for a metal-resin bonded structured body according to the embodiment of the present invention. As shown in FIG. 1, the surface of a metal base to be bonded to a polymer resin is first irradiated with UV-light (ultraviolet light) to remove organic contaminants. Next, a coating is applied to the metal base by immersing the metal base in a solution of an organometallic compound followed by a heat treatment in a baking furnace (e.g., at 280° C.) in an air atmosphere for 10 to 120 min. Then, an encapsulating epoxy resin kneaded with a silica filler is molded onto the metal base and baked for hardening at 150 to 200° C., thereby completing the bonding procedure shown by the flow of FIG. 1. The baked coating has a multi-layer structure including: a layer of an oxide of the metal provided by decomposition of the organometallic compound; and a reaction layer formed by reaction of the metal of the organometallic compound and the metal of the underlying metal base. The formation of the coating proceeds by diffusion and bonding of metal atoms released from the organometallic compound. Here, there is a limitation to how far the released atoms can diffuse. Thus, the coating assumes a microstructure of a population of fine particles and, as a natural result, has a low density because it has numerous voids between such fine particles. Another result is that the coating has surface microroughness.

The thus fabricated metal-resin bonded structured bodies were measured for the bonding (shear) strength using a button shear test. Several different measurement samples were prepared as follows: Metal bases made of Cu were used and their surfaces were electroplated with Ni. The thus plated metal bases were surface treated (coated) using one of the following organometallic compounds: aluminum 2-ethylhexanoate, titanium neodecanoate, zinc 2-ethylhexanoate, and zirconium 2-ethylhexanoate. These organometallic compounds were diluted with a mixed solvent of toluene, acetone, and an alcohol. A solution having a high metal concentration (0.15 to 0.25 wt %) was used for samples provided with a thicker coating, while a solution having a low metal concentration (0.04 to 0.06 wt %) was used for samples provided with a thinner coating. The coatings were then baked in an air atmosphere at 280° C. for 60 min. The sample named "As-Plated" is a metal base electroplated with nickel without the above-mentioned coating treatment. The sample named "Plating and Baking" is one in which the metal base is electroplated with nickel followed by baking in an air atmosphere at 280° C. for 60 min without the above-mentioned coating treatment. For some of the samples, an additional sample was prepared by subjecting the plated metal base to an UV-light irradiation pre-treatment. An epoxy resin containing a flame retardant and a silica filler was molded onto the plated metal base of each sample into a 5-mm diameter button shape. The button shear test was carried out by positioning a shearing tool 0.2 mm above the surface of the plated metal base of each sample and using a shearing rate of 0.1 mm/s.

Figure 2:
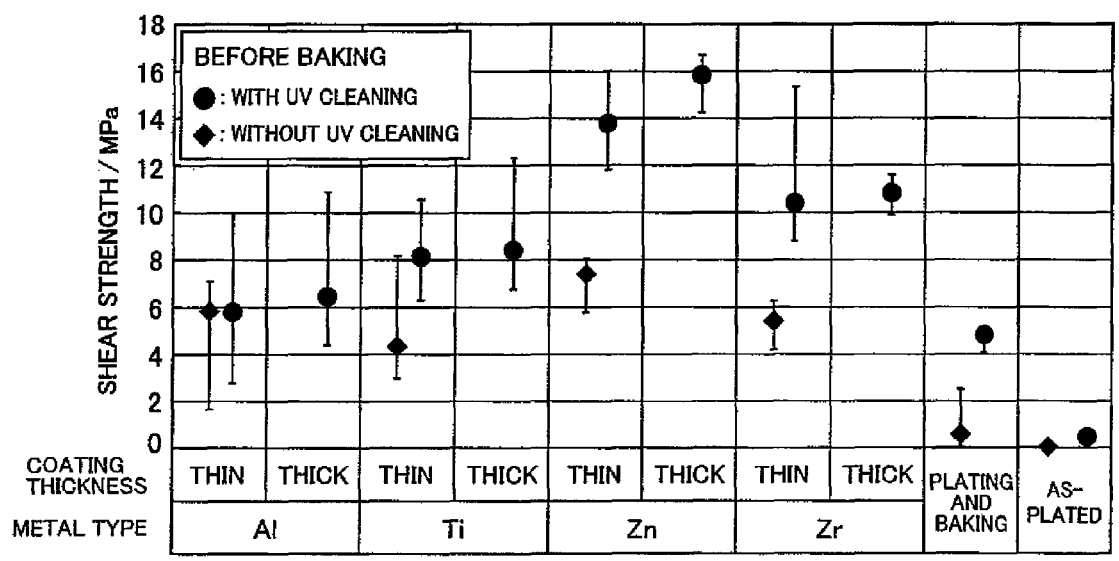
FIG. 2 shows the results of button shear measurement for various metal-resin bonded structured bodies.

FIG. 2 shows the results of shear strength measurement for various metal-resin bonded structured bodies. As shown, the shear (bonding) strengths of the "As-Plated" samples are nearly zero irrespective of the presence or absence of the UV-light irradiation cleaning. The Zn- and Zr-coated samples with the UV-light irradiation cleaning exhibit a shear (bonding) strength of as high as 10 to 16 MPa. The Al- and Ti-coated samples also exhibit an apparent improvement in the bonding strength. Each of the samples having a thicker coating tends to exhibit a higher shear strength than its counterpart sample having a thinner coating. However, a separately conducted test (not described herein) showed that samples having a thicker coating than the prescribed value in the present invention exhibited a fracture of the coating or a peeling at the interface between the coating and the underlying nickel plating, at far lower shear stresses.

FIG. 3 is an SEM image of a cross section about a bonding region of the above-mentioned sample in which a thicker Zn coating is applied according to the present invention. As shown in FIG. 3, a Zn coating is formed between the Ni plating layer and the encapsulating epoxy resin, and the Zn coating is formed of two layers: a layer containing a population of fine oxide particles and a reaction layer of Zn and Ni. The total thickness of the Zn coating is approximately 170 nm; the thickness of the reaction layer is approximately 40 nm; and the thickness of the oxide particle layer is approximately 130 nm. The encapsulating resin is made of a whitish silica filler of spherical or crushed shape and a polymer resin matrix.

Figure 4:
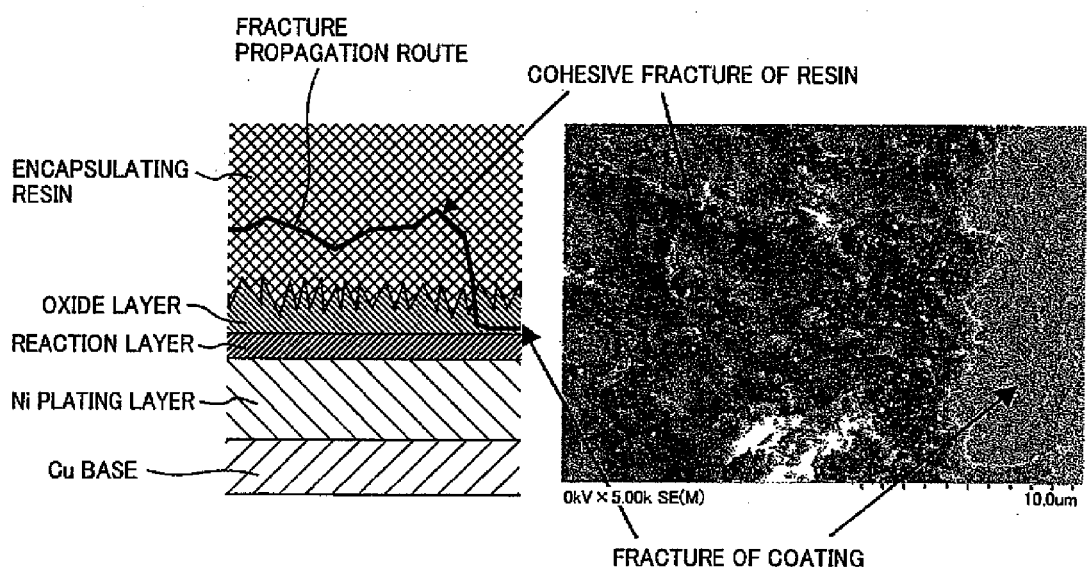
FIG. 4 is an SEM image of a fractured surface of the FIG. 3 sample after a shear test and a schematic illustration showing the cross-sectional view thereof with the fracture propagation route.

FIG. 4 is an SEM image of a fractured surface of the FIG. 3 sample after a shear test and a schematic illustration showing the cross-sectional view thereof with the fracture propagation route. In the SEM image of FIG. 4, the dark region represents the encapsulating resin still adhered to the coated metal base, and the bright region represents the Zn-oxide particle layer or the Zn—Ni reaction layer exposed to the fracture surface. This shear test confirmed that only a cohesive fracture of the resin and a fracture of the coating occurred, and no interfacial delamination occurred between the encapsulating resin and the coating or between the coating and the underlying Ni plating. This indicates that the adhesive strengths at these interfaces are enhanced.

Figure 5:
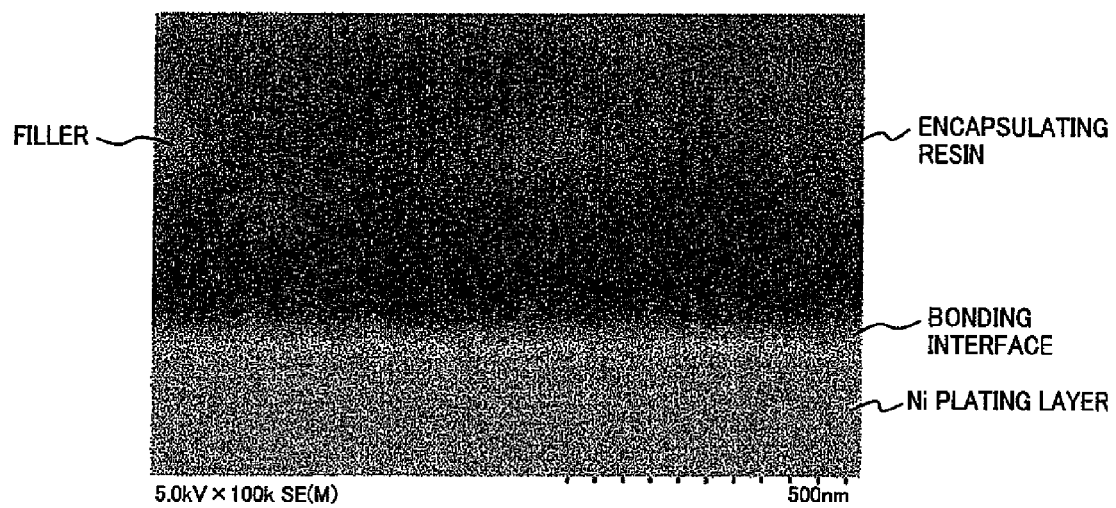
FIG. 5 is an SEM image of a cross section (etched by a focused ion beam technique) about a bonding region of a metal-resin bonded structured body in which a thicker Zr coating is applied according to the present invention.
Figure 6:
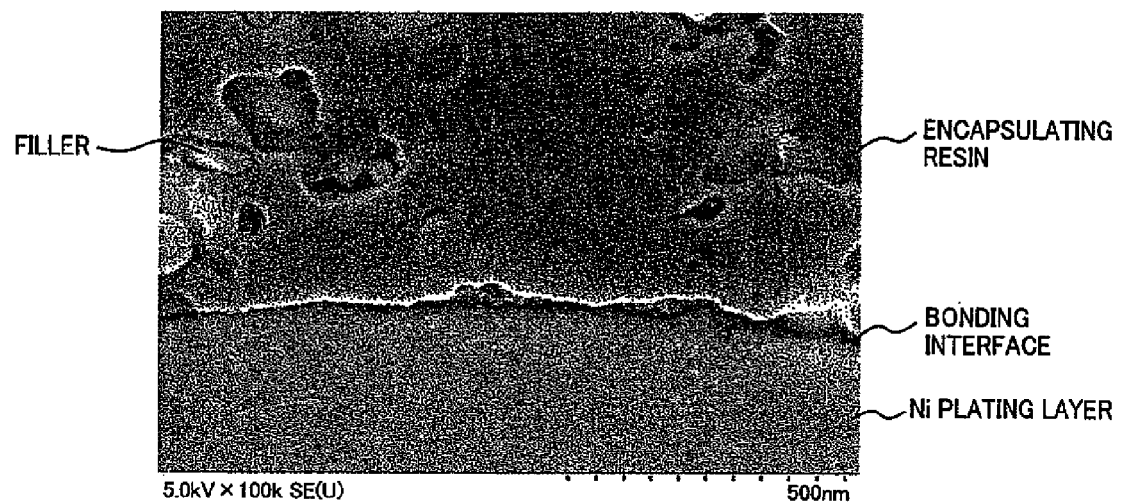
FIG. 6 is an SEM image of a cross section obtained by further ion etching the FIG. 5 cross section.

FIG. 5 is an SEM image of a cross section (etched by a focused ion beam technique) about a bonding region of the above-mentioned sample in which a thicker Zr coating is applied according to the present invention. No noticeable defects were observed at the interface between the encapsulating resin and the Ni plating; instead, a whitish-appearing layer about 30 nm thick was observed at the interface. Although not exactly clarified, the bonding interface probably has a structure such that the coating layer microscopically adheres with the overlying encapsulating resin. FIG. 6 is an SEM image of a cross section obtained by further ion etching of the FIG. 5 cross section. The Zr-oxide layer formed at the bonding interface is etched deeper than the other areas because its texture is more readily etched. Conversely, the presence of such a readily etchable layer strongly suggests that a Zr-oxide layer is actually present at the bonding interface region.

As described in the above embodiment, the invention can form a coating containing an oxide of a metal (such as Zn, Zr, Al, and Ti) and having surface microroughness by a simple procedure including the steps of: applying a solution containing a low concentration of an organometallic compound decomposable below 350° C. onto a metal base; and baking the applied solution at 280° C. in an air atmosphere. Thus, the invention can provide high bonding strength between Ni and polymer resins which are usually difficult to bond to Ni, and therefore a high reliability metal-resin bonded structured body can be provided.

The usable thickness of the coating depends on the metal type of the organometallic compound used, but the maximum thickness effective in enhancing bonding strength is approximately 500 to 600 nm. And, the minimum thickness effective in enhancing bonding strength is approximately 5 nm. Hence, the preferable coating thickness for improving bonding strength between Ni and resins is 5 to 600 nm.

Metals (contained in organometallic compounds) usable for improving bonding strength are not limited to the above-mentioned four types. For example, it is confirmed by separately conducted tests that metals which bond with oxygen more strongly than Ni (i.e., having a free energy of oxide formation less than that of Ni) such as V, Mg, Mn, and Ta (tantalum) can provide the similar effect of improving bonding strength.

Figure 7:
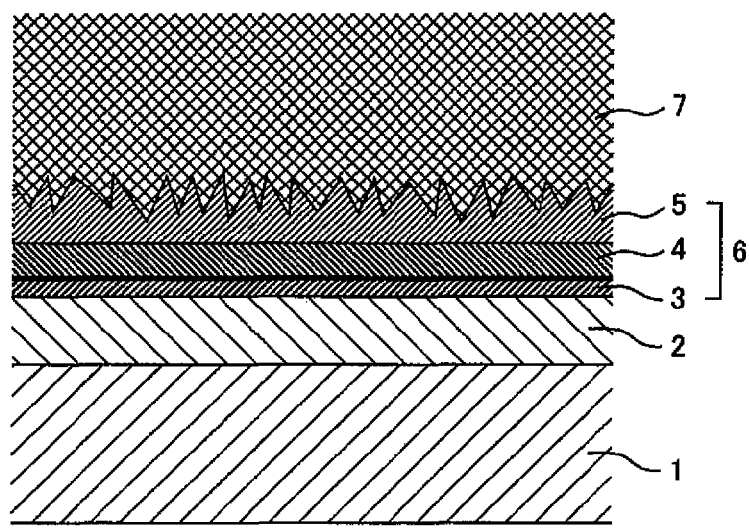
FIG. 7 is a schematic cross-sectional view illustrating a possible bonding interface structure of a metal-resin bonded structured body of the present invention.

FIG. 7 is a schematic cross-sectional view illustrating a possible bonding interface structure of the metal-resin bonded structured body of the present invention. As shown in FIG. 7, an Ni plating 2 is applied onto a Cu base 1. On the Ni plating 2 is formed a coating 6 including: a reaction layer 3 of Ni and a coating metal having a free energy of oxide formation less than that of Ni; a layer 4 of the coating metal; and a layer 5 of an oxide of the coating metal. On the oxide layer 5 having a surface microroughness is further applied a polymer resin 7. The coating metal having a free energy of oxide formation less than that of Ni is preferably Zn, Zr, Al, Ti, V, Mn, Mg, and Ta, of which Zn is most preferred.

In the FIG. 7 structure, a surface-microroughened layer of an oxide of a metal which can strongly bond to polymer resins is formed on an Ni layer which usually has poor adhesiveness to polymer resins, thus providing a metal-resin bonded structure having excellent bondability. In addition, between the coating 6 and the Ni plating 2 there is present a reaction layer formed by reaction of the two layers, thereby providing a metallic-bonded interface structure. This can prevent peeling of the coating 6, thus providing a high reliability metal-resin bonded structured body. While in this embodiment organometallic compounds containing 2-ethylhexanoate or neodecanoate are used as the ligand, other organometallic compounds containing a ligand such as octylic acid, methacrylic acid, acrylic acid, naphthenic acid, acetate, and diethyl compounds can provide similar effects.

Figure 8:
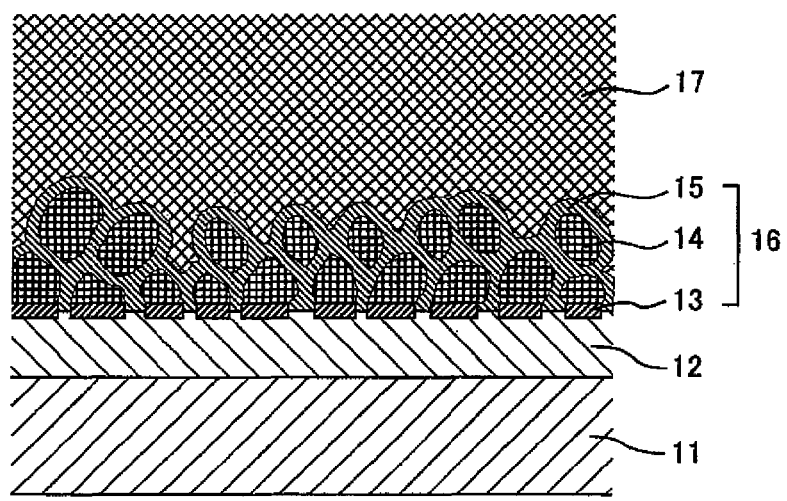
FIG. 8 is a schematic cross-sectional view illustrating another possible bonding interface structure of a metal-resin bonded structured body of the invention.

FIG. 8 is a schematic cross-sectional view illustrating another possible bonding interface structure of the metal-resin bonded structured body of the invention. As shown in FIG. 8, an Ni plating 12 is applied onto a Cu base 11. On the Ni plating 12 is formed a coating 16 including: reaction islands 13 formed by reaction of Ni and a coating metal having a free energy of oxide formation less than that of Ni; particles 14 made of the coating metal; and oxides 15 (of the coating metal) encrusting the respective particles 14. A polymer resin layer 17 is provided on the roughened surface of the layer containing the numerous oxides 15. Similarly to the FIG. 7 structure, the FIG. 8 structure can also provide a high reliability metal-resin bonded structured body having excellent bondability.

Figure 9:
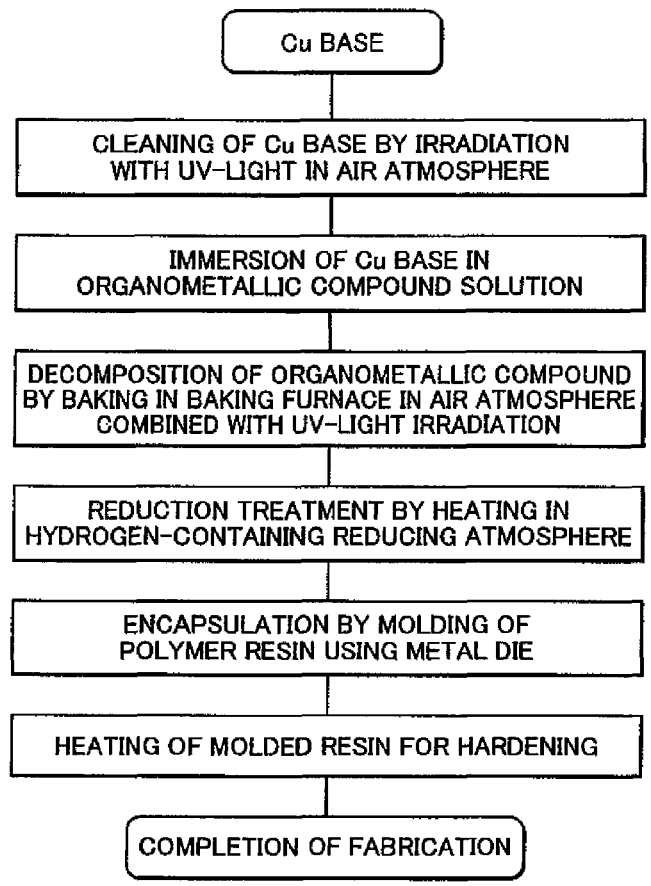
FIG. 9 is a process flow showing a fabrication method for a Cu-base/resin bonded structured body according to the present invention.

FIG. 9 is a process flow showing a fabrication method for a Cu-base/resin bonded structured body according to the present invention. Generally, the Cu is a readily oxidizable metal; therefore, when the Cu is heat-treated for a long period, of time in an oxidizing atmosphere, a comparatively thick oxide layer tends to be grown. Such a thick oxide layer has poor adhesiveness, and therefore can be peeled off by even a small stress. So, when the Cu is used as a metal base, the growth of such a thick oxide layer needs to be prevented. As shown in FIG. 9, the surface of a Cu base is first irradiated with UV-light to clean adhered organic contaminants, and then a liquid coating is applied to the Cu base by immersing the Cu base in a solution of an organometallic compound. Next, to promote decomposition of the organometallic compound, the liquid coating is baked in an air atmosphere while being irradiated with UV-light; thereby the baking temperature can be lowered compared to the FIG. 1 method. A coating of an oxide of the metal (contained in the organometallic compound) is formed on the surface of the Cu base by this baking treatment, but at the same time a surface region of the Cu base is somewhat oxidized. So, thereafter, the Cu oxide layer is reduced by heating in a reducing (deoxidizing) atmosphere containing hydrogen. The metal oxide of the surface coating is not readily reduced by hydrogen, and therefore receives little effect from this reduction treatment. Finally, a resin is molded onto the thus coated Cu base and baked for hardening, thereby completing the fabrication of a metal-resin bonded structured body. When zinc 2-ethylhexanoate is used as the organometallic compound, the baking temperature can be lowered, by combination with the UV-light irradiation treatment, to 150-230° C. compared to 230-280° C. used in the FIG. 1 method without the UV-light irradiation. Thus, oxidation of Cu can be reduced. Alternatively, the reduction treatment temperature may be raised to 250° C. in order to reduce the treatment time.

Figure 10:
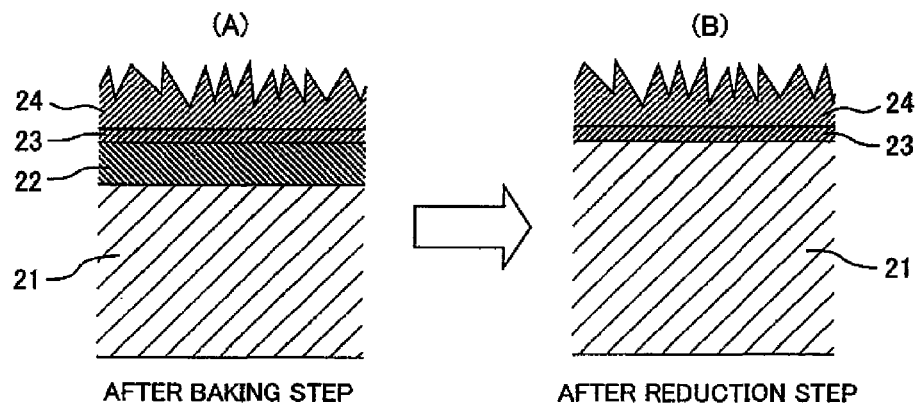
FIG. 10 is schematic cross-sectional views of a bonding interface of a Cu-base/resin bonded structured body fabricated according to the FIG. 9 process flow, respectively after the baking treatment and after the reduction treatment.

FIG. 10 is schematic cross-sectional views of a bonding interface of a Cu-base/resin bonded structured body fabricated according to the FIG. 9 process flow, respectively after the baking treatment and after the reduction treatment. As shown in FIG. 10, after the baking treatment, a Cu—Zn reaction layer 23 and a Zn-oxide coating 24 are formed on the surface of a Cu base 21, and a Cu-oxide layer 22 is grown underneath the Cu—Zn reaction layer 23. The strength and adhesiveness of the Cu-oxide layer 22 are poor; therefore, if a polymer resin is bonded to the thus fabricated structure without any further treatment, the Cu-oxide layer 22 will fracture or be peeled off by even a small stress. As a result, only poor bondability can be obtained. By contrast, after the reduction treatment at 250° C. is given, the Cu-oxide layer 22 is reduced by hydrogen while the Zn-oxide remains unchanged (because it is not significantly reduced by hydrogen at 250° C.). As a result, the Cu-oxide layer underneath the Cu—Zn reaction layer 23 is completely reduced back to metallic Cu. The reason why the underlying Cu-oxide layer 22 is reduced by hydrogen is because the Zn-oxide coating 24 has numerous voids and therefore hydrogen can readily permeate through the Zn-oxide coating 24. The Zn-oxide coating 24 and the polymer resin are strongly adhered to each other by the mechanical adhesion effect of the surface microroughness of the coating as well as the O—O chemical bonding force at the interface. The adhesive strength between the Zn-oxide coating 24 and the Cu—Zn reaction layer 23, the adhesive strength between the Cu—Zn reaction layer 23 and the Cu base, and the fracture strength of the Cu—Zn reaction layer 23 are all sufficiently high. Therefore, the overall bonding strength between the polymer resin and the Cu base is determined by the typically strong fracture strength of the polymer resin.

As described in FIGS. 9 and 10, even for a Cu base which is readily oxidized and tends to grow an undesirably thick oxide layer, there can be provided strong bonding strength to resins by providing a Zn coating formed by baking an organic Zn compound followed by a reduction treatment. Thus, a metal-resin bonded structured body having high bonding strength can be provided.

Figure 11:
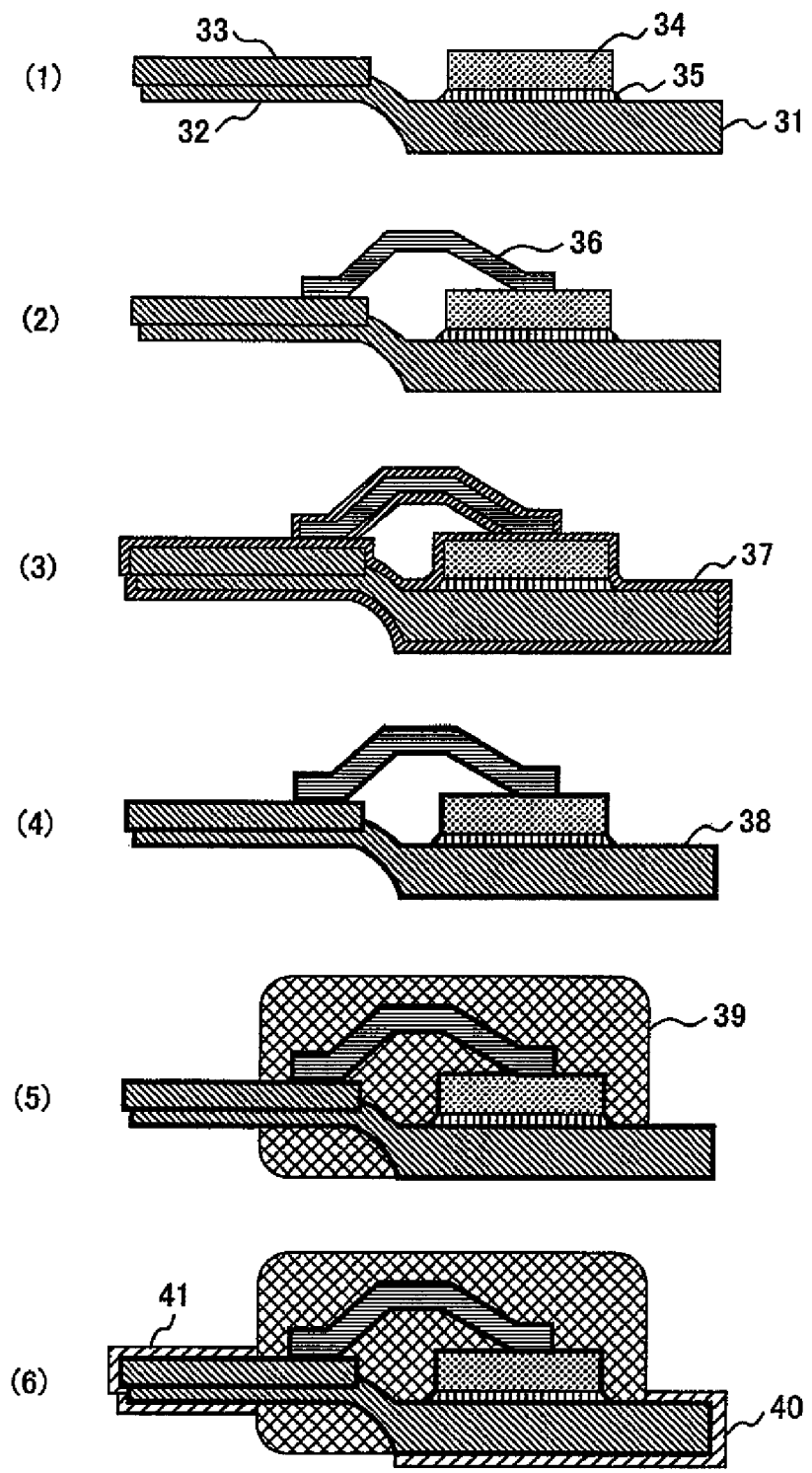
FIG. 11 is a schematic process flow illustrating a fabrication method for a resin encapsulated semiconductor device according to the present invention.
Figure 12:
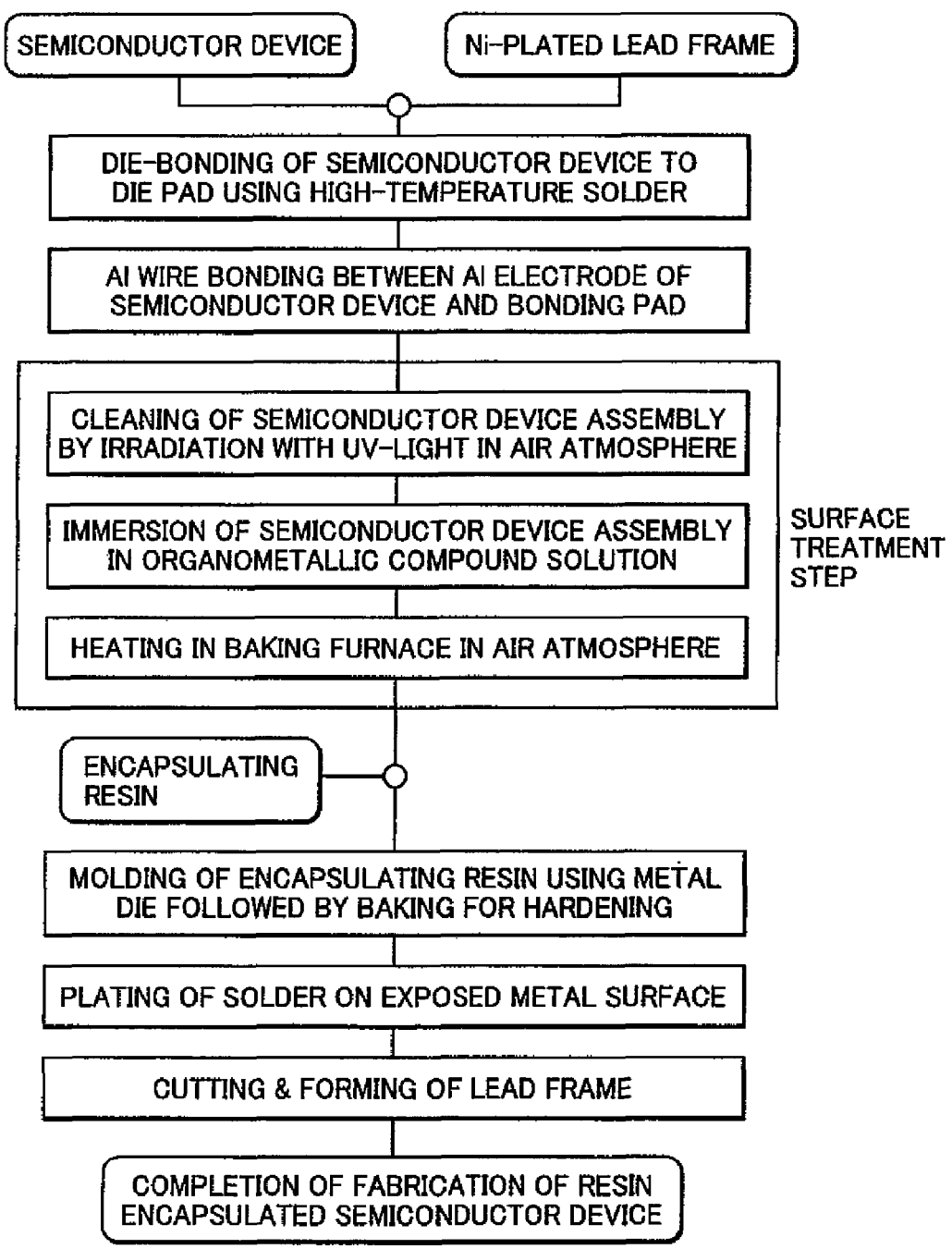
FIG. 12 is the flow chart of the FIG. 11 fabrication method.

FIG. 11 is a schematic process flow illustrating a fabrication method for a resin encapsulated semiconductor device according to the present invention. FIG. 11(1) shows the step of die-bonding a semiconductor device 34 to a die pad 31 of an entirely Ni plated lead frame using a high melting point high lead solder 35. FIG. 11(2) shows the step of electrically connecting (wire bonding) an electrode of the semiconductor device 34 to a lead 33 of the lead frame via an Al wire 36. FIG. 11(3) shows the step of applying an organometallic-compound containing solution 37 over the entire surface of the thus bonded semiconductor assembly. FIG. 11(4) shows the (baking) step of baking the applied solution 37 for decomposition and forming a baked coating layer 38 made of an oxide of the metal of the organometallic compound and strongly bonded to the semiconductor assembly. FIG. 11(5) shows the step of molding an encapsulating resin 39 to entirely cover the semiconductor device 34 and the Al wire 36 and partially cover the die pad 31 and the lead frame leads 32 and 33. FIG. 11(6) shows the step of plating solders 40 and 41 on the remaining exposed surfaces of the assembly. FIG. 12 is the flow chart of the FIG. 11 fabrication method. Prior to the application of the organometallic-compound containing solution, the surfaces of the semiconductor assembly are cleaned by irradiation with UV-light in order to enhance adhesiveness between the baked coating and the Ni plating layer. In addition, the baking step is performed while irradiating the solution with UV-light to lower the heating temperature.

As described, the fabrication method shown in FIGS. 11 and 12 can greatly enhance bondability between an encapsulating resin and a semiconductor device assembly by forming a baked metal-oxide coating on the assembly before molding the resin onto the assembly, without adding any significant complexity to conventional semiconductor device assembly methods. Thus, there can be provided, at a low fabrication cost comparable to conventional ones, a high-reliability resin encapsulated semiconductor device having a long product life even in harsh environments such as high temperature, high humidity, and severe thermal cycles.

Figure 13:
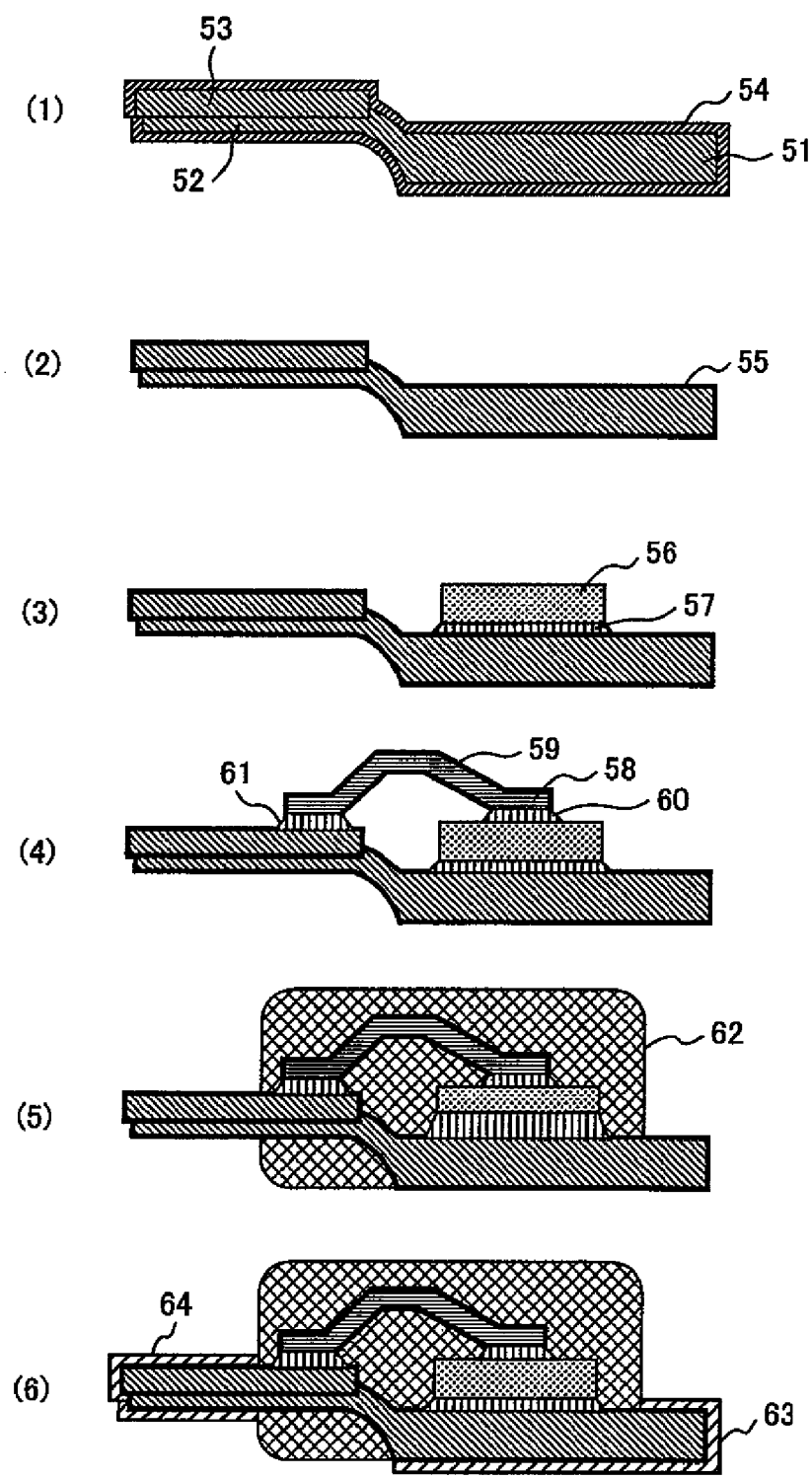
FIG. 13 is a schematic process flow illustrating another fabrication method for a resin encapsulated semiconductor device according to the invention.

FIG. 13 is a schematic process flow illustrating another fabrication method for a resin encapsulated semiconductor device according to the invention. FIG. 13(1) shows the step of applying an organic Zn-compound containing solution 54 over the entire surface of an tinplated Cu lead frame having a die pad 51 and leads 52 and 53. FIG. 13(2) shows the step of baking the applied solution 54 for decomposition and then reducing an underlying Cu-oxide layer to form a coating 55 mainly containing Zn-oxide and strongly adhered to the lead frame. FIG. 13(3) shows the step of die-bonding a semiconductor device 56 to the die pad 51 of the thus coated Cu lead frame using a lead-free solder 57. FIG. 13(4) shows the lead connecting step of electrically connecting, by soldering 60 and 61, an electrode of the semiconductor device 56 and the lead 53 via a Cu wire whose surface is coated with a coating 59 mainly containing Zn-oxide. FIG. 13(5) shows the step of molding an encapsulating resin 62 to entirely cover the semiconductor device 56 and the Cu wire 58 and partially cover the die pad 51 and the leads 52 and 53. FIG. 13(6) shows the step of plating solders 63 and 64 on the remaining exposed surfaces of the assembly. The baking step is performed at 320° C. because heat sensitive components (such as the semiconductor device) have not yet been bonded to the heat resistant lead frame. In addition, the succeeding reduction treatment is performed in a hydrogen atmosphere at 350° C. to reduce the treatment time. The die-bonding and lead connecting steps are performed using a high temperature lead free flux-cored solder.

As described, the fabrication method shown in FIG. 13 can enhance bondability between an encapsulating resin and a semiconductor device assembly (including a lead frame, a semiconductor device, and an electrode connection wire). Thus, there can be provided a high-reliability resin encapsulated semiconductor device mounted on a Cu lead frame package, in which the product life is greatly increased even in harsh environments such as high temperature, high humidity, and severe thermal cycles. Also, a metal-oxide coating is provided on the surfaces of the Cu lead frame, and therefore oxidation of the Cu body can be retarded even at high temperatures. Thus, the high-temperature reliability of a resin encapsulated semiconductor device mounted on a Cu lead frame can be improved.

Figure 14:
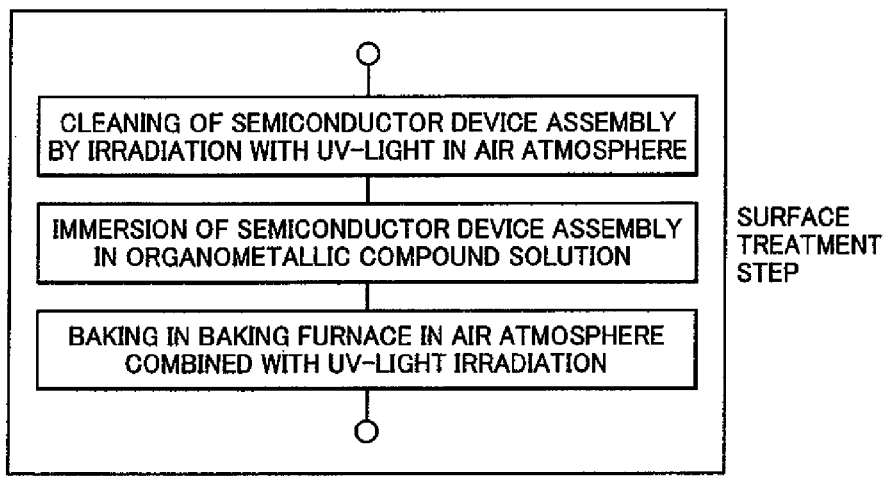
FIG. 14 is a flow chart of an alternative surface treatment applicable to the FIG. 12 fabrication method for a resin encapsulated semiconductor device.

FIG. 14 is a flow chart of an alternative surface treatment applicable to the FIG. 12 fabrication method for a resin encapsulated semiconductor device. As shown in FIG. 14, the UV-light irradiation cleaning and the immersion in an organometallic compound are the same as those used in the FIG. 12 method, but the baking is assisted by an UV-light irradiation treatment in order to lower the baking temperature.

Figure 15:
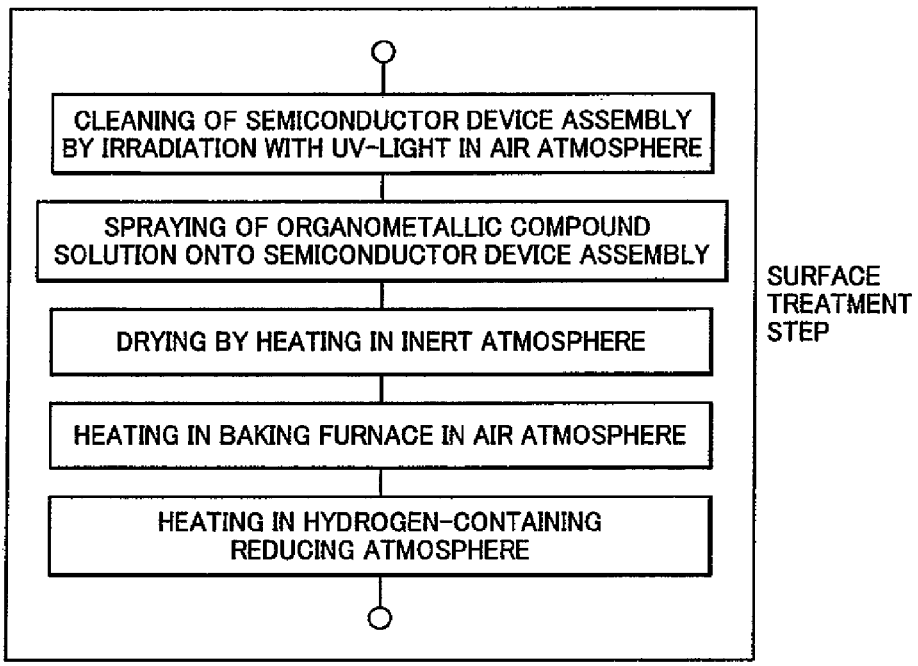
FIG. 15 is a flow chart of another alternative surface treatment applicable to the FIG. 12 fabrication method.

FIG. 15 is a flow chart of another alternative surface treatment applicable to the FIG. 12 fabrication method. As shown in FIG. 15, the first step of UV-light irradiation cleaning is the same as that used in the FIG. 12 method, but thereafter an organometallic compound is applied by spraying, and first dried in an inert atmosphere and then baked in an oxidizing atmosphere, and further the semiconductor device assembly is reduced by heating in a reducing atmosphere. The FIG. 15 method first dries an organic solvent solution of an organometallic compound in an inert atmosphere, and therefore poses no danger of explosion of flammable vapor, thus having an advantage of a highly safe assembly.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A fabrication method for a resin encapsulated semiconductor device comprising a wiring substrate having first and second electrical connection metallic terminals; a semiconductor device; an electrical connector for electrically connecting the second electrical connection terminal to the semiconductor device; and an insulating encapsulating resin covering at least a portion of an assembly composed of the wiring substrate, the semiconductor device, and the electrical connector, the fabrication method including the steps of:
    (1) die-bonding the semiconductor device to the first electrical connection metallic terminal;
    (2) electrically connecting an electrode of the semiconductor device and the second electrical connection metallic terminal via the electrical connector;
    (3) surface treating the assembly by applying, to a surface of the assembly, a solution containing an organometallic compound decomposable at 350° C. or lower, wherein the metal of the organometallic compound has a free energy of oxide formation less than those of surface materials of the assembly, and a ligand of the organometallic compound is selected from a group consisting of 2-ethylhexanoate, neodecanoate, octylic acid, methacrylic acid, acrylic acid, naphthenic acid, acetate, and diethyl compounds, and then baking the applied solution in an oxidizing atmosphere to form, on the surface of the assembly, a coating containing an oxide of the metal of the organometallic compound; and
    (4) transfer-molding the insulating encapsulating resin onto the surface-treated assembly.

2. The fabrication method according to claim 1, wherein:
the organometallic compound includes a metal "M" different from the surface materials of the assembly and an organic molecule made of carbon, hydrogen, and oxygen atoms, the number of carbon atoms in the organic molecule being 30 or less;
a solvent of the solution is an organic solvent capable of dissolving the organometallic compound or water; and
the content of the metal "M" in the solution is from 0.001 to 1.0 wt %.

3. The fabrication method according to claim 1, wherein the baking of the applied solution in the step (3) is performed at temperatures from 150 to 400° C.

4. The fabrication method according to claim 1, wherein prior to the applying of the solution in the step (3), the fabrication method further includes a step of cleaning the surface of the wiring substrate by one of: dry chemical cleaning by irradiation with UV-light in ozone gas; physicochemical cleaning in an argon or oxygen plasma; or heating in a reducing atmosphere at 200° C. or higher.

5. The fabrication method according to claim 1, wherein between the baking of the applied solution in the step (3) and the step (4) of transfer-molding the insulating encapsulating resin, the fabrication method further includes a step of performing a reduction treatment by heating in a hydrogen-containing reducing atmosphere.

6. The fabrication method according to claim 1, wherein the baking of the applied solution in the step (3) is performed simultaneously with irradiating the surface of the assembly with UV-light.

7. A fabrication method for a resin encapsulated semiconductor device comprising a wiring substrate having first and second electrical connection metallic terminals; a semiconductor device; an electrical connector for electrically connecting the second electrical connection terminal to the semiconductor device, and insulating encapsulating resin covering at least a portion of an assembly composed of the wiring substrate, the semiconductor device, and the electrical connector, the fabrication method including the steps of:
    (1) die-bonding the semiconductor device to the first electrical connection metallic terminal;
    (2) electrically connecting an electrode of the semiconductor device and the second electrical connection metallic terminal via the electrical connector;
    (3) surface treating the assembly by applying, to a surface of the assembly, a solution containing an organometallic compound decomposable at 350° C. or lower, wherein the metal of the organometallic compound is selected from a group consisting of Zn, Zr, Al, Ti, V, Mn, and Mg, and a ligand of the organometallic compound is selected from a group consisting of 2-ethylhexanoate, neodecanoate, octylic acid, methacrylic acid, acrylic acid, naphthenic acid, acetate, and diethyl compounds, and then baking the applied solution in an oxidizing atmosphere to form, on the surface of the assembly, a coating containing an oxide of the metal of the organometallic compound; and
    (4) transfer-molding the insulating encapsulating resin onto the surface-treated assembly.

8. The fabrication method according to claim 7, wherein:
the organometallic compound includes a metal "M" different from the surface materials of the assembly and an organic molecule made of carbon, hydrogen, and oxygen atoms, the number of carbon atoms in the organic molecule being 30 or less;
a solvent of the solution is an organic solvent capable of dissolving the organometallic compound or water; and
the content of the metal "M" in the solution is from 0.001 to 1.0 wt %.

9. The fabrication method according to claim 7, wherein the baking of the applied solution in the step (3) is performed at temperatures from 150 to 400° C.

10. The fabrication method according to claim 7, wherein prior to the applying of the solution in the step (3), the fabrication method further includes a step of cleaning the surface of the wiring substrate by one of: dry chemical cleaning by irradiation with UV-light in ozone gas; physicochemical cleaning in an argon or oxygen plasma; or heating in a reducing atmosphere at 200° C. or higher.

11. The fabrication method according to claim 7, wherein between the baking of the applied solution in the step (3) and the step (4) of transfer-molding the insulating encapsulating resin, the fabrication method further includes a step of performing a reduction treatment by heating in a hydrogen-containing reducing atmosphere.

12. The fabrication method according to claim 7, wherein the baking of the applied solution in the step (3) is performed simultaneously with irradiating the surface of the assembly with UV-light.

* * * * *